(12) United States Patent
Planey

(10) Patent No.: US 7,122,885 B2
(45) Date of Patent: *Oct. 17, 2006

(54) FLIP-CHIP PACKAGING

(75) Inventor: William Planey, Plano, TX (US)

(73) Assignee: Lovoltech, Inc., Santa Clara, CA (US)

( * ) Notice: Subject to any disclaimer, the term of this patent is extended or adjusted under 35 U.S.C. 154(b) by 169 days.

This patent is subject to a terminal disclaimer.

(21) Appl. No.: 10/728,449

(22) Filed: Dec. 5, 2003

(65) Prior Publication Data

US 2004/0113247 A1    Jun. 17, 2004

Related U.S. Application Data

(63) Continuation of application No. 10/215,570, filed on Aug. 9, 2002, now Pat. No. 6,747,342.

(51) Int. Cl.
*H01L 23/495* (2006.01)
*H01L 23/057* (2006.01)
(52) U.S. Cl. .................... 257/676; 257/666; 257/670
(58) Field of Classification Search ............... 257/364, 257/666, 667, 735, 676
See application file for complete search history.

(56) References Cited

U.S. PATENT DOCUMENTS

| | | | | |
|---|---|---|---|---|
| 5,293,058 A | * | 3/1994 | Tsividis | 257/364 |
| 5,452,511 A | * | 9/1995 | Chang | 29/827 |
| 5,917,240 A | * | 6/1999 | Ideta et al. | 257/723 |
| 6,040,626 A | * | 3/2000 | Cheah et al. | 257/735 |
| 6,747,342 B1 | * | 6/2004 | Planey | 257/666 |
| 6,809,408 B1 | * | 10/2004 | Yu et al. | 257/676 |

FOREIGN PATENT DOCUMENTS

EP    0370745    *    5/1990

OTHER PUBLICATIONS

Merriam Webster's collegiate Dictionay, tenth edition, p. 114, 130.*
H. Ogiwara, M. Hayakawa, T. Nishimura and M. Nakaoka; "High-Frequency Induction Heating Inverter with Multi-Resonant Mode Using Newly Developed Normally-Off Type Static Induction Transistors"; Department of Electrical Engineering, Ashikaga Institute of Technology, Japan; Department of Electrical Engineering, Kobe University, Japan; pp. 1017-1023.
J. Baliga; "Highvoltage Junction-Gate Field Effect Transistor wth recessed gates"; IEEE Transactions on Electron Devices; vol. ED-29; No. 10; Oct. 1982.

(Continued)

*Primary Examiner*—Andy Huynh
*Assistant Examiner*—Dao H. Nguyen
(74) *Attorney, Agent, or Firm*—Morgan, Lewis & Bockius LLP

(57) ABSTRACT

A semiconductor die mounted between an X-lead frame and a support structure without bonding wires or straps. A power enhancement mode junction field effect transistor (JFET) die having a top surface defining a drain, and a bottom surface having a first metalized region defining a source and a second metalized region defining a gate, is positioned on a support structure. An X-lead frame is bonded to the support structure such that electrical contact is made with an external lead. Angular projections from the X-lead frame make contact with the top surface of the JFET, hold the die in place on the support structure, and form electrical continuity between the JFET drain and the external lead. A construction on the surface of the support structure is positioned directly under the source region on the bottom of the JFET die and forms electrical continuity between the JFET source and a second external lead.

13 Claims, 9 Drawing Sheets

OTHER PUBLICATIONS

J. M. C. Stork et al.; "Small Geometry Depleted Base Bipolar Transistors (BSIT)- VLSI Devices?"; IEEE Transactions on Electron Devices; vol. ED-28; No. 11; Nov. 1981.

Nishizawa et al.; "Analysis of Static Characteristics of a Bipolar Mode SIT (BSIT)"; IEEE Transactions on Electron Devices; vol. ED-29; No. 11; Aug. 1982.

Caruso et al.; "Performance Analysis of a Bipolar Mode FET (BMFET) with Normally Off Characteristics"; IEEE Transactions on Power Electronics; vol. 3; No. 2; Apr. 1988.

Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

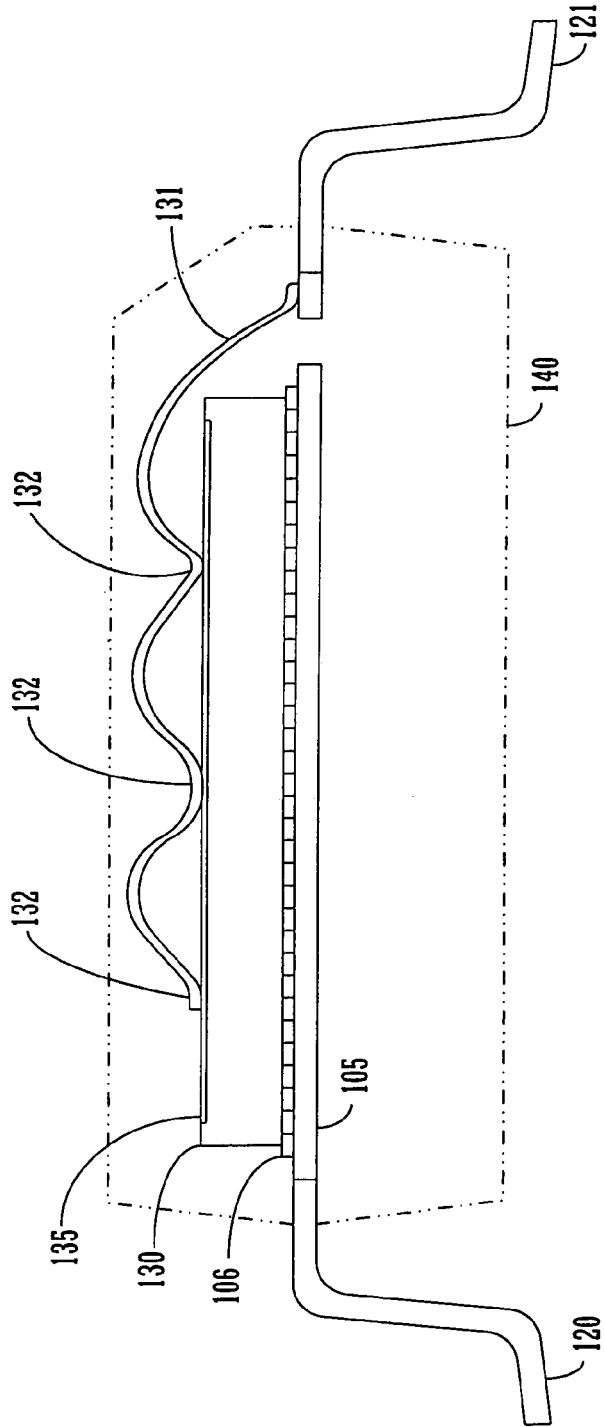
FIGURE 2 -- Prior Art --

400

FLIP-CHIP PACKAGING

RELATED APPLICATIONS

This application is a continuation of U.S. Ser. No. 10/215,570, filed Aug. 9, 2002, U.S. Pat. No. 6,747,342.

BACKGROUND OF THE INVENTION

The following U.S. patent application Ser. No. 09/430,500, "NOVEL JFET STRUCTURE AND MANUFACTURE METHOD FOR LOW ON RESISTANCE AND LOW VOLTAGE APPLICATIONS", Ho-Yuan Yu, filed 2 Dec. 1999, is incorporated herein by reference for all purposes. The following copending U.S. patent application Ser. No. 09/708,336, "STARTER DEVICE FOR NORMALLY "OFF" JFETS", Ho-Yuan Yu, filed 7 Nov. 2000, is incorporated herein by reference for all purposes. The following copending U.S. patent application Ser. No. 09/708,336, "SEMICONDUCTOR PACKAGE FOR POWER JFET HAVING COPPER PLATE FOR SOURCE AND WIRE BOND OR RIBBON CONTACT FOR GATE", Ho-Yuan Yu, filed 2 Mar. 2001, is incorporated herein by reference for all purposes.

1. Field of the Invention

The present invention is related to semiconductor packaging including the manner in which a semiconductor die ismechanically connected to a supporting structure as well as the methods used for making electrical connections to electrode pads on the die.

2. Related Art

With reference to FIG. 1, a semiconductor package 100 according to the prior art is shown. The semiconductor package 100 includes a bottom plate portion 105 and terminals 120, 121. A semiconductor die 130 is disposed on top of the bottom plate portion 105 and fastened thereto, typically using an epoxy material. The semiconductor die 130 includes a metalized region 135 (typically aluminum) defining a connection area for a top surface of the semiconductor die 130. Portions of the terminals 120, 121, bottom plate portion 105, and semiconductor die 130 are encapsulated in a housing 140, typically formed from a moldable material.

In order to obtain an electrical connection between the metalized region 135 and the terminal(s) 121, one or more wires 122 are ultrasonically bonded at one end 123 to the metalized region 135 and at a distal end 124 to the terminal 121. One surface of the semiconductor die 130 is coupled to the bottom plate 105 by means of a conductive material 106. In the case of a die 130 that is a single Junction Field Effect Transistor (JFET), the surface of the die coupled to the bottom plate 105 by means of the conductive material 106 is typically the drain of the FET. The JFET source is typically coupled to the metalized region 135 and the terminal(s) 121 by one or more wires 122 that are ultrasonically bonded at one end 123 to the metalized region 135 and at a distal end 124 to the terminal 121. Contact to the JFET gate is typically made by electrically coupling via a conductive ribbon.

FIG. 2 shows another semiconductor package 200 of the prior art. In order to electrically connect the metalized region 135 with the terminal 121, one or more wires 131 are stitch bonded at locations 132, thereby providing additional paths for current to flow from the semiconductor die 130 to the terminal 121. This marginally reduces the resistance of the current path from the semiconductor die 130 to the terminal 121.

It is desirable to significantly reduce the resistance and inductance of current paths through a power semiconductor package in order to ensure optimum performance of the semiconductor device. Unfortunately, the semiconductor packages of the prior art do not fully achieve this objective because, among other things, the distance D shown in FIG. 1 between one area of the metalized region 135 and the end 123 of the wires 122 increases the resistance of the current path from the metalized region 135 to the terminal 121. This problem is exacerbated when the thickness of the metalized region 135 is relatively small (typically, the thickness is approximately 4 to 8 microns). The relatively thin metalized region 135 in combination with the distance D and the cross sectional profile of the wire bonds 122 results in a relatively high resistance and inductance for the current path there through.

When the semiconductor package 100 includes, for example, an FET semiconductor die 130, the resistance caused by the distance D and the relatively small diameter of the wires 122, 131 adds to the overall resistance of the FET. Indeed, when die 130 is a FET die, the terminals 120 are typically coupled to the drain of the FET while the terminals 121 are coupled to the source of the FET via one or more wire bonds 122. As ON resistances of FET dies become smaller and smaller, the resistance caused by the distance D and the wire bonds 122, 131 become a larger and larger portion of the overall resistance from one terminal 120 to another terminal 121. Of course, the resistance and inductance from terminal to terminal significantly affect the high frequency performance of a semiconductor device such as a power FET.

Some prior art packages have incorporated a large metal strap to obtain an electrical connection between the metalized region 135 and terminal 121. Unfortunately, this technique has only been possible in large semiconductor packages having relatively simple surface structures, such as bipolar junction transistors, diodes, and thyristors. Further, the metal straps were not practical in small outline packages (such as S08, surface mount dual in line packages). The use of a large metal strap in a gated device, such as an FET, has not heretofore been achieved because such devices have relatively complex surface structures. In particular, gated devices typically include a gate runner (or bus), disposed on the surface of the semiconductor die, which traverses the surface such that gate potential is distributed over the surface of the die. Consequently, disposing a large metal strap over the surface of the die has been problematic because the gate runner restricts access to the die surface and could be shorted to the metal strap. Thus, the use of metal straps in gated semiconductor devices has been prohibitive.

Referring again to FIG. 1, coupling the JFET source to the metalized region 135 and the terminal(s) 121 by one or more wires 122 that are ultrasonically bonded at one end 123 to the metalized region 135 places limitations on the design and layout of the semiconductor die. Ultrasonic bonding of the wire 122 at a distal end 124 to the terminal 121 also places restrictions on the overall package design and layout. Making contact to the JFET gate by ultrasonically bonding a conductive ribbon to a designated region on the semiconductor die is subject to similar problems.

Referring again to FIG. 2, electrically connecting the metalized region 135 with the terminal 121 is realized by stitch bonding one or more wires 131 at locations 132. Again, this technique places limitations on the design and layout of the semiconductor die itself. Further, ultrasonic bonding of the wire 131 the terminal 121 also places restrictions on the overall package design and layout. In this configuration, making contact to the JFET gate by ultrasonically bonding a conductive ribbon to a designated region on the semiconductor die remains subject to similar design and layout problems.

SUMMARY OF THE INVENTION

Accordingly, there is a need for alternative methods of packaging a semiconductor die that overcomes the deficiencies in the prior art. More particularly, the problems associated with bonding wires and or straps to surfaces on the semiconductor die include limitations on the die structure itself as well as limitations on structures used to support the semiconductor die. The present invention overcomes these limitations, as well as others to be described herein, by eliminating the need for bonding to surface regions on the semiconductor die.

A semiconductor die mounted between an X-lead frame and a support structure without bonding wires or straps is described. A power enhancement mode junction field effect transistor (JFET) die having a top surface defining a drain, and a bottom surface having a first metalized region defining a source and a second metalized region defining a gate, is positioned on a support structure. An X-lead frame is bonded to the support structure such that electrical contact is made with an external lead. Angular projections from the X-lead frame make contact with the top surface of the JFET, hold the die in place on the support structure, and form electrical continuity between the JFET drain and the external lead. A construction on the surface of the support structure is positioned directly under the source region on the bottom surface of the JFET die and forms electrical continuity between the JFET source and a second external lead. An additional construction on the surface of the support structure is positioned directly under the gate region on the bottom surface of the JFET die and forms electrical continuity between the JFET gate and a third external lead. Contacts between the drain, source and gate regions on the JFET die and the three corresponding external leads are made without the need for bonding wires and or straps to the surface regions on the JFET die. The support structure, X-lead frame and JFET die assembly is adaptable for various standard encapsulating housings such as the SO8.

In one embodiment of the present invention, an X-lead frame is coupled to an underlying support structure such that the X-lead frame is electrically connected to an external lead extending from the support structure. A semiconductor die is positioned between the X-lead frame and the underlying support structure. In the present embodiment, the semiconductor die is an enhancement mode power JFET, the top surface of which provides an electrical contact region for the JFET drain. The X-lead frame is formed with angular extensions that are in physical contact with the upper surface of the JFET die. These angular extensions hold the JFET die in place as well as make electrical contact with the JFET drain. Furthermore, the points at which the angular extensions contact the JFET drain region are determined to maximize the efficiency at which drain current passes from the JFET die to the X-lead frame. The X-lead frame is thus a structure providing electrical coupling between the drain region of the JFET die and an external lead in the absence of any bonding to the JFET die.

In the present embodiment, an electrical conductor constructed on the underlying support structure provides electrical coupling between an external lead and a predetermined location defined as the source pad. The configuration of the source pad is designed to make mechanical and electrical contact with the JFET source region located on the lower surface of the JFET die. The JFET die is placed over the support structure such that the JFET source region is directly over and in contact with the configuration on the source pad. Electrical coupling between the JFET source region and an external lead is thus provided in the absence of any bonding to the JFET die.

Continuing the present embodiment, a separate electrical conductor constructed on the underlying support structure provides electrical coupling between an external lead and a predetermined location defined as the gate pad. The configuration of the gate pad is designed to make mechanical and electrical contact with the JFET gate region located on the lower surface of the JFET die. The JFET die is placed over the support structure such that the JFET gate region is directly over and in contact with the configuration on the gate pad. Electrical coupling between the JFET gate region and an external lead is thus provided in the absence of any bonding to the JFET die.

BRIEF DESCRIPTION OF THE DRAWINGS

FIG. 2 is a cross-sectional view of a semiconductor package according to prior art.

DETAILED DESCRIPTION OF THE INVENTION

In the following detailed description of the present invention, flip-chip packaging, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Figure 1:
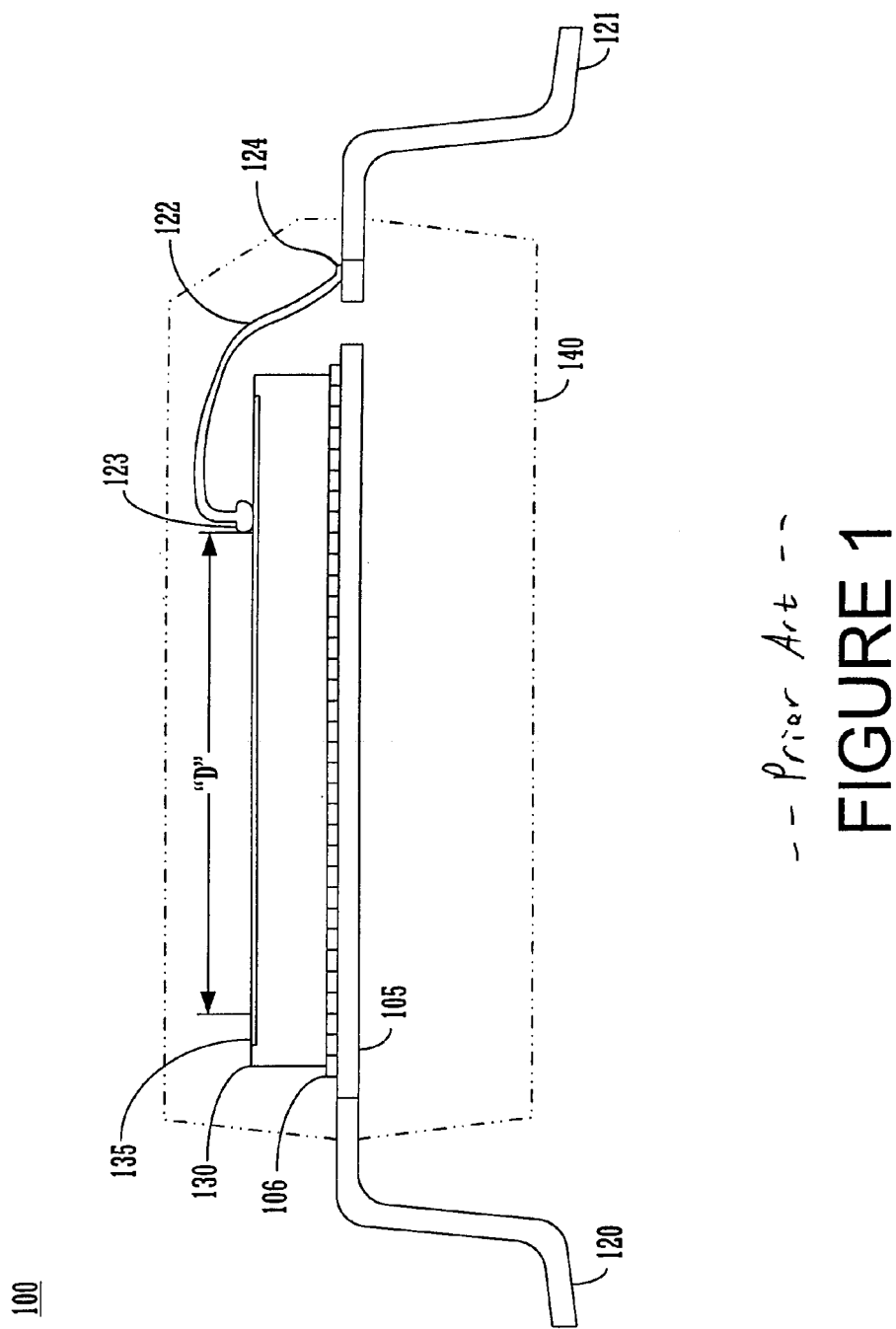
FIG. 1 is a cross-sectional view of a semiconductor package according to prior art.
Figure 3A:
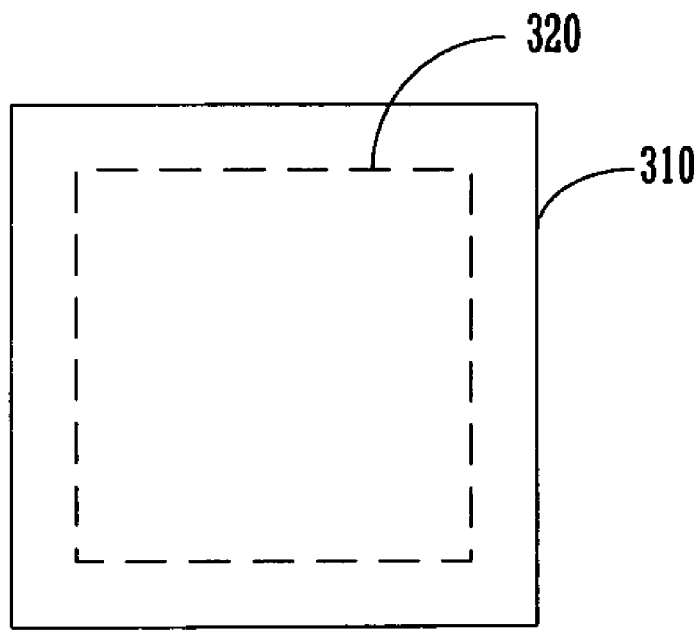
FIG. 3A is a top view of a semiconductor die according to the present invention.

FIG. 3A is a top view 300 of a semiconductor die 310 consisting of an enhancement mode power junction field effect transistor (JFET) according to the present invention. The region enclosed by the dashed line 320 is available for electrical connection to the drain of the JFET.

Figure 3B:
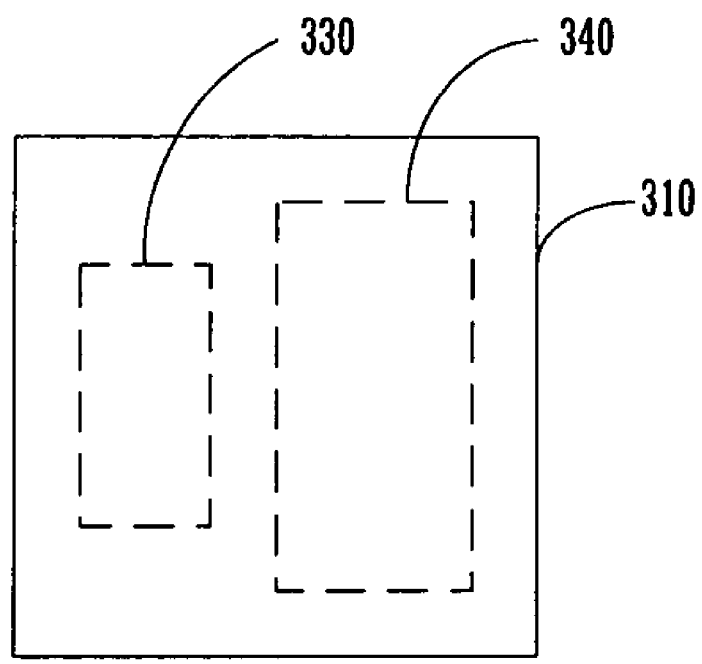
FIG. 3B is a bottom view of a semiconductor die according to the present invention.

FIG. 3B is a bottom view 300 of a semiconductor die 310 consisting of an enhancement mode power junction field effect transistor (JFET) according to the present invention. The smaller region 330 enclosed by a dashed line is available for electrical connection to the gate of the JFET. The larger region 340 enclosed by a dashed line is available for electrical connection to the source of the JFET.

Figure 4:
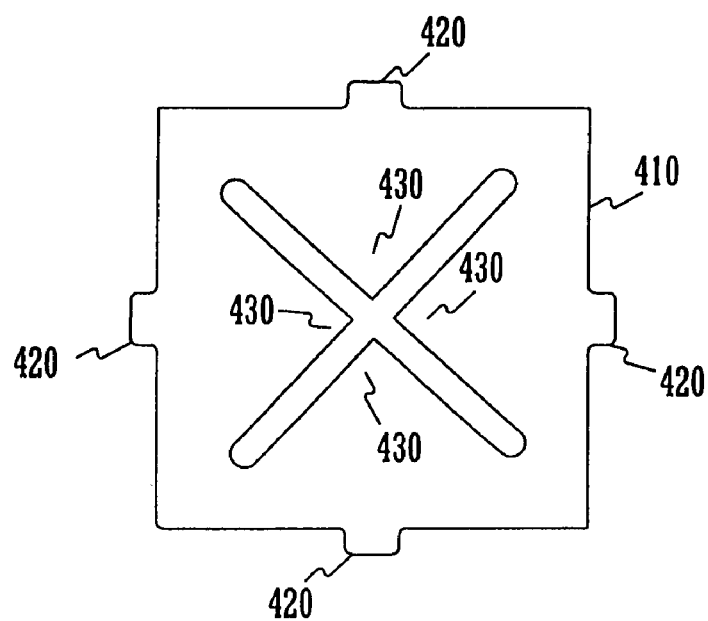
FIG. 4 is a view of a single X-lead frame according to prior art.

FIG. 4 is a view 400 of a single X-lead frame 410 according to prior art. The four tabs 420 are used for bonding the X-lead frame to an underlying structure. The four angular tabs 430 extend at angles such that they make mechanical and electrical contact with a surface of an adjacent semiconductor die. In one embodiment of the present invention, these four angular tabs make mechanical and electrical contact with the drain of the power JFET located on the top surface of the JFET die. The points at which the angular tabs contact the JFET drain region are determined to maximize the efficiency at which drain current passes from the JFET die to the X-lead frame.

Figure 5:
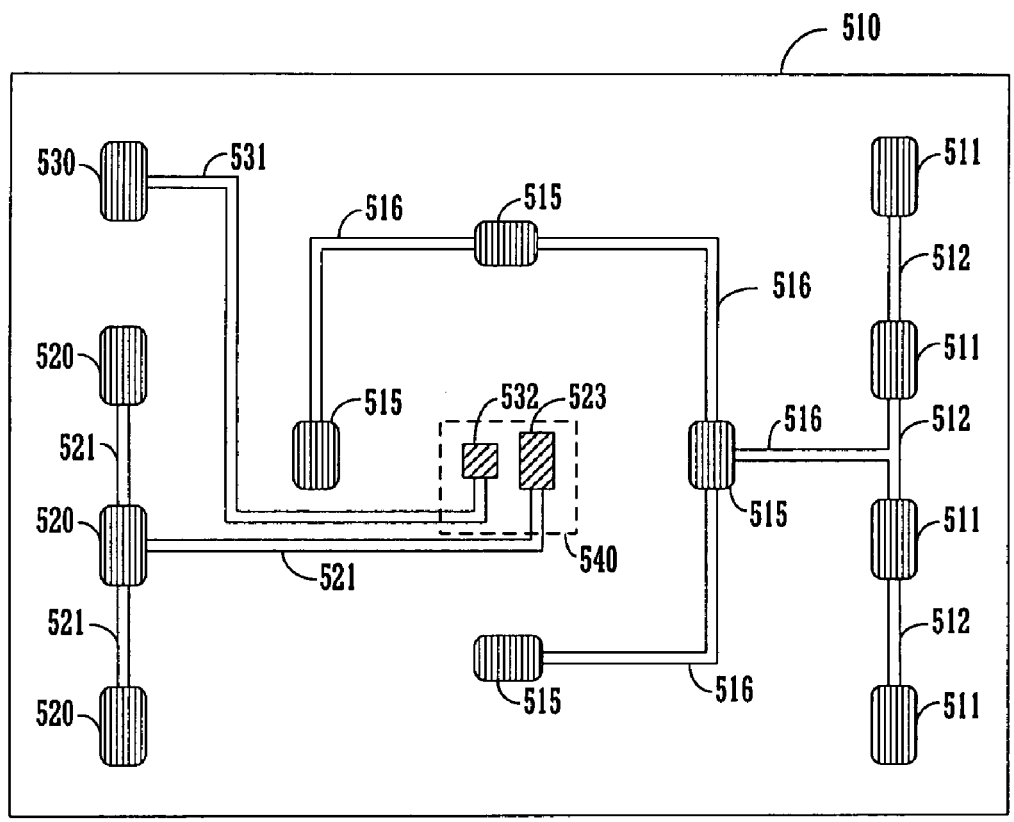
FIG. 5 is a plan view of a mounting surface for a semiconductor die in one embodiment of the present invention.

FIG. 5 is a plan view 500 of a mounting surface 510 for a semiconductor die in one embodiment of the present invention. In the present configuration, the mounting surface 510 is arranged to accommodate enclosure within an SO8 structure. The four conductive pads 511 are connected electrically by extensions 512 and are available for bonding to external leads. The four conductive pads 515 are used to bond to the four mounting tabs 420 on the X-lead frame. These four conductive pads 515 are coupled to one another and to the four conductive pads 511 by conductive extensions 516. An electrical conduction path is thus formed between the external leads connected to pads 511, through extensions 512, 516, pads 515 and through the X-lead frame angular tabs to the drain region contacting the power JFET die surface.

Referring still to FIG. 5, the three conductive pads 520 are available for bonding to external leads. These three pads 520 are coupled and connected electrically by extensions 521 to a region 523 on the mounting surface 510. The region 523 is designed to make mechanical and electrical contact with the source region located on the lower surface of the JFET die. Electrical connection between the JFET source and external leads is thus accomplished without bonding to the JFET die along the path from region 523 following conductive extensions 521 to conductive pads 520.

Conductive pad 530 in FIG. 5 is available for bonding to an external lead, and is coupled electrically by conductive extension 531 to region 532. Region 532 is designed to make mechanical and electrical contact with the gate region located on the lower surface of the JFET die. Electrical connection between the JFET gate and an external lead is thus accomplished without bonding to the JFET die along the path from region 532 following conductive extension 531 to conductive pad 530.

The dashed line 540 in FIG. 5 indicates the proper location for placement of the JFET die over the mounting surface in one embodiment of the present invention. It is to be appreciated that FIG. 5 is only one of many possible arrangements for placing a power JFET die between a mounting surface and an X-lead frame, and simultaneously accomplishing mechanical support for the die as well as electrical coupling between the die and external leads without bonding to one or more surface areas on the die.

Figure 6:
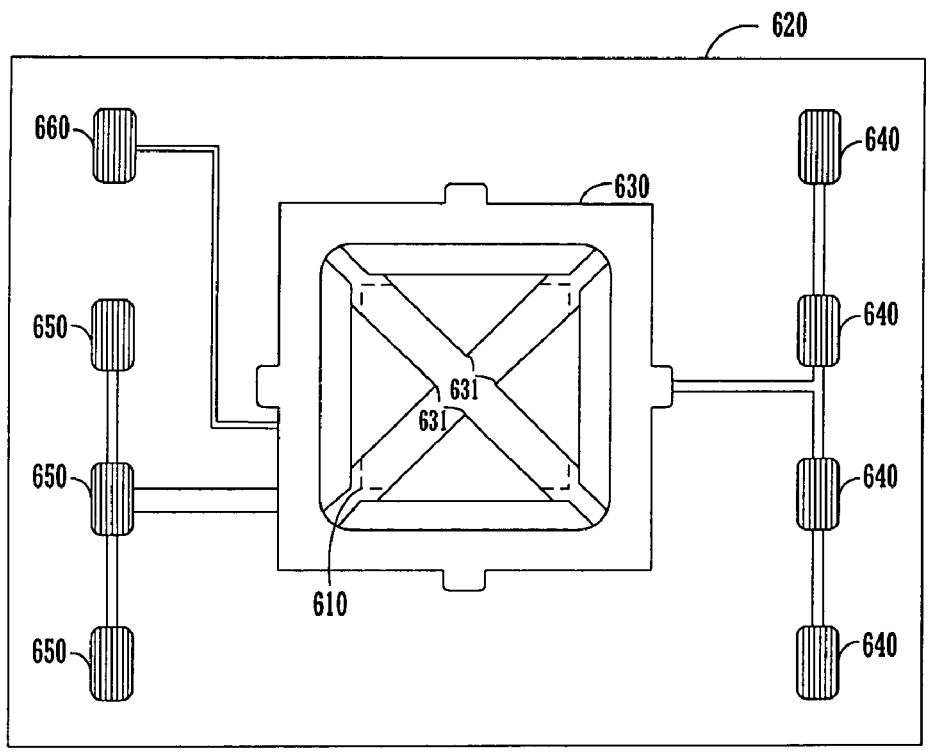
FIG. 6 is a plan view showing a semiconductor die disposed between a mounting surface and an X-lead frame in one embodiment of the present invention.

FIG. 6 is a plan view 600 showing a power semiconductor JFET die 610 disposed between a mounting surface 620 and an X-lead frame 630 in one embodiment of the present invention. The drain region of the JFET is located on the top surface of the JFET die and is coupled electrically to the X-lead frame 630 by means of the angular lead frame extensions 631. The X-lead frame 630 is coupled to the four external leads 640 which provide electrical connection to the JFET drain. The external lead 650 provides electrical connection to the JFET source located on the lower surface of the JFET die. The external lead 660 provides electrical connection to the JFET gate located on the lower surface of the JFET die.

Figure 7:
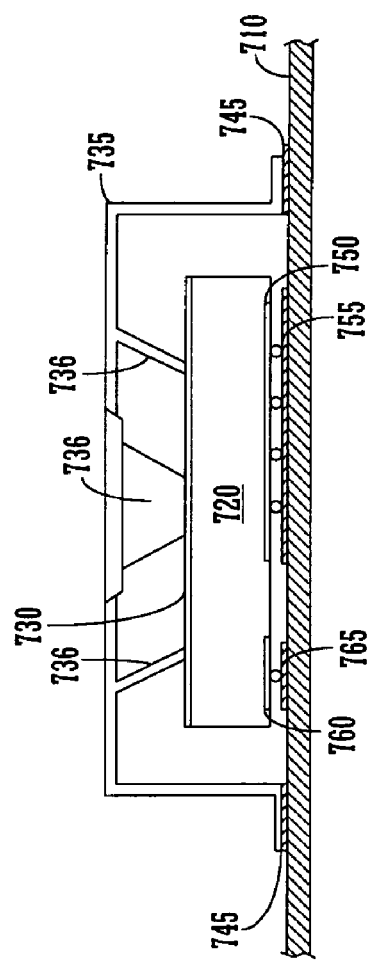
FIG. 7 is a cross-sectional view of a semiconductor die disposed between a mounting surface and an overlying X-lead frame bonded to the mounting surface in one embodiment of the present invention.

FIG. 7 is a cross-sectional view 700 of a power JFET die 720 disposed between a mounting surface 710 and an overlying X-lead frame 735 bonded to the mounting surface 710 in one embodiment of the present invention. The X-lead frame 735 is coupled to conductive pads 745 located on the mounting surface 710. Angular extensions 736 from the X-lead frame 735 make contact with the drain region 730 located on the upper surface of the JFET die 720. The structure 755 provides mechanical and electrical coupling to the JFET source region 750 located on the lower surface of the JFET die. The structure 765 provides mechanical and electrical coupling to the JFET gate region 760 located on the lower surface of the JFET die.

Figure 8:
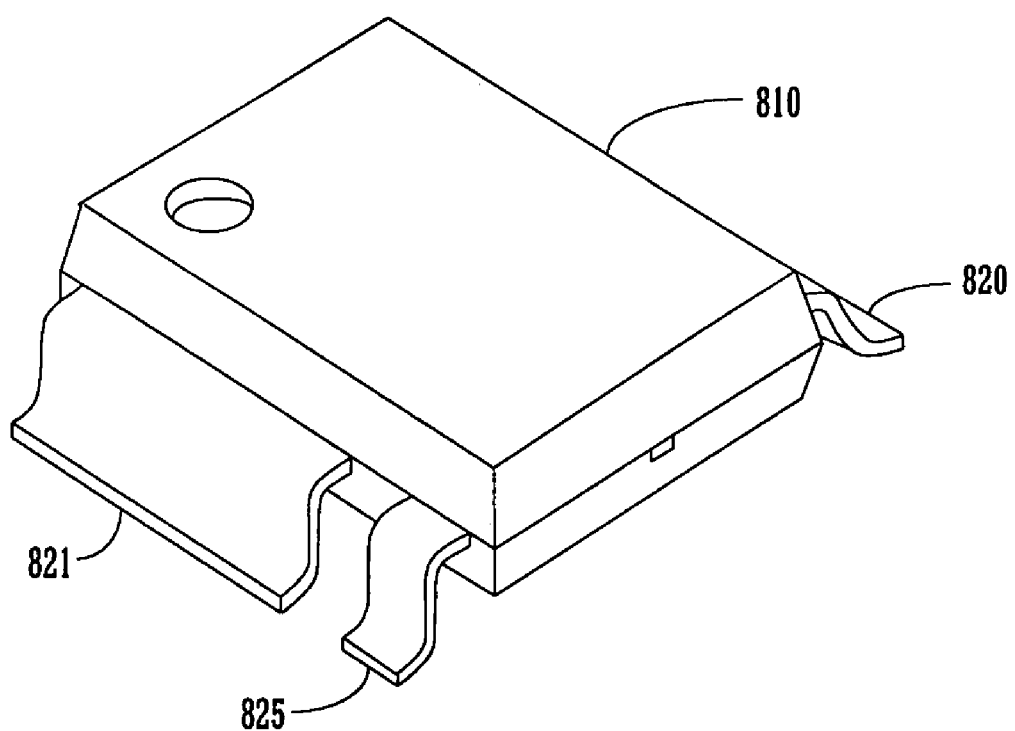
FIG. 8 is a perspective view showing the completed package of one embodiment of the present invention.

FIG. 8 is a perspective view 800 showing the completed package 810 of one embodiment of the present invention. In this configuration, the package 810 has dimensions similar to a standard SO8 will altered external lead arrangements. Using the references of FIG. 7, the power JFET die 720 disposed between the mounting surface 710 and the overlying X-lead frame 735 are entirely enclosed within the moldable package 810. The widest external lead 820 is a solid structure spanning the width of four SO8 pins and the spaces between them, and is connected internally to the drain side of the JFET die. The large source lead 821 is a solid structure spanning the width of three SO8 pins and the spaces between them, and is connected internally to the source region located on the bottom side of the JFET die. The gate lead 825 is the width of a single SO8 pin and is connected internally to the gate region located on the bottom side of the JFET die.

The preferred embodiment of the present invention, semiconductor package for power JFET having copper plate for source and wire bond or ribbon contact for gate, is thus described. While the present invention has been described in particular embodiments, it should be appreciated that the present invention should not be construed as limited by such embodiments, but rather construed according to the below claims.

The invention claimed is:

1. A system mounting a semiconductor die within a package comprising:

a mounting surface;

an X-lead frame coupled to said mounting surface; and said semiconductor die, wherein said semiconductor die is disposed between and held in place by said mounting surface and said X-lead frame without bonding to said mounting surface and without bonding to said X-lead frame.

2. A package as described in claim 1 wherein said semiconductor die is a power enhancement mode JFET having a surface region defining a source, a surface region defining a drain and a surface region defining a gate.

3. The power semiconductor package of claim 2 wherein electrical coupling between said drain and said X-lead frame is realized by angular projections of said X-lead frame contacting said drain.

4. The power semiconductor package of claim 2 wherein said X-lead frame is bonded to a first terminal disposed on said mounting surface.

5. The power semiconductor package of claim 2 wherein a second terminal disposed on said mounting surface is electrically connected to said source.

6. The power semiconductor package of claim 2 wherein a third terminal disposed on said mounting surface is electrically connected to said gate.

7. The semiconductor package of claim 1, wherein said package is sized and shaped to conform to an S08 configuration.

8. The semiconductor package of claim 1, wherein said first terminal is a solid terminal spanning the full width of four leads and the spaces between four leads on one side of said S08 package.

9. The semiconductor package of claim 1, wherein said second terminal is a solid terminal spanning a width of three leads and the spaces between three leads on a side of said S08 package opposite to said first terminal.

10. The semiconductor package of claim 1, wherein said third terminal is a solid terminal spanning a width of a single lead on a side of said S08 package opposite to said first terminal.

11. The semiconductor package of claim 1 wherein said X-lead frame comprises at least one angular extension configured to make physical and electrical contact with said semiconductor die.

12. The semiconductor package of claim 11 wherein said mounting surface comprises at least one source pad configured to make mechanical and electrical contact with said semiconductor die.

13. The semiconductor package of claim 1 wherein said mounting surface comprises at least one source pad configured to make mechanical and electrical contact with said semiconductor die.

* * * * *